(12) United States Patent
Elson et al.

(10) Patent No.: US 10,448,264 B2
(45) Date of Patent: Oct. 15, 2019

(54) ROTATABLE ANTENNA APPARATUS

(71) Applicant: Airspan Networks Inc., Boca Raton, FL (US)

(72) Inventors: David Charles Elson, Crewe (GB); Martin Lysejko, Bagshot (GB)

(73) Assignee: AIRSPAN NETWORKS INC., Boca Raton, FL (US)

( * ) Notice: Subject to any disclaimer, the term of this patent is extended or adjusted under 35 U.S.C. 154(b) by 734 days.

(21) Appl. No.: 15/186,955

(22) Filed: Jun. 20, 2016

(65) Prior Publication Data

US 2016/0380350 A1     Dec. 29, 2016

(30) Foreign Application Priority Data

Jun. 25, 2015 (GB) .................................. 1511200.6
Aug. 25, 2015 (GB) .................................. 1515091.5

(51) Int. Cl.
*H01Q 1/08* (2006.01)
*H04W 24/02* (2009.01)
(Continued)

(52) U.S. Cl.
CPC ............ *H04W 24/02* (2013.01); *F16M 11/06* (2013.01); *G01S 3/043* (2013.01); *G01S 3/14* (2013.01);
(Continued)

(58) Field of Classification Search
CPC ....... H04W 24/02; H04W 4/50; H04W 24/08; H04W 24/10; H04W 28/0236;
(Continued)

(56) References Cited

U.S. PATENT DOCUMENTS 497,147 A    5/1893   Urich
3,789,415 A  1/1974   Vickland
(Continued)

FOREIGN PATENT DOCUMENTS

CN    103247855 A    8/2013
CN    203733925 U    7/2014
(Continued)

OTHER PUBLICATIONS

PCT Search Report from PCT/GB2016/051411 (corresponding to U.S. Appl. No. 15/187,159), dated Aug. 1, 2016, 11 pgs.
(Continued)

*Primary Examiner* — Gwendolyn W Baxter
(74) *Attorney, Agent, or Firm* — Haynes Beffel & Wolfeld LLP

(57) ABSTRACT

A rotatable antenna apparatus has a fixed unit for attachment of the apparatus to an external structure, and a rotatable unit mounted on the fixed unit for rotation relative to the fixed unit. The rotatable unit comprises both an antenna assembly and processing circuitry coupled to the antenna assembly for performing signal processing operations. The apparatus further includes a thermally conductive shaft connected to the rotatable unit and located for rotation within the fixed unit, and a thermally conductive coupling structure to conduct heat from one or more heat generating components of the processing circuitry into the thermally conductive shaft. A heat sink within the fixed unit is thermally coupled to the thermally conductive shaft to draw heat away from the thermally conductive shaft. This provides an efficient mechanism for removing heat from the rotatable unit, whilst still allowing the rotatable unit to be sealed against external environmental conditions.

14 Claims, 11 Drawing Sheets

(51) Int. Cl.
| | |
|---|---|
| G01S 19/53 | (2010.01) |
| G01S 3/14 | (2006.01) |
| G01S 5/02 | (2010.01) |
| H01Q 1/02 | (2006.01) |
| H01Q 3/04 | (2006.01) |
| H01Q 3/24 | (2006.01) |
| H01Q 3/26 | (2006.01) |
| H01Q 21/06 | (2006.01) |
| H01Q 21/08 | (2006.01) |
| H01Q 21/20 | (2006.01) |
| H01Q 21/28 | (2006.01) |
| H01Q 25/00 | (2006.01) |
| H04B 7/06 | (2006.01) |
| H04B 7/08 | (2006.01) |
| H04W 28/02 | (2009.01) |
| H04W 88/04 | (2009.01) |
| H05K 7/20 | (2006.01) |
| H04L 12/24 | (2006.01) |
| H04L 29/08 | (2006.01) |
| H04W 16/28 | (2009.01) |
| H04W 40/22 | (2009.01) |
| H04W 72/08 | (2009.01) |
| H04W 24/10 | (2009.01) |
| H01Q 1/24 | (2006.01) |
| H01Q 1/50 | (2006.01) |
| H01Q 3/10 | (2006.01) |
| H04W 72/04 | (2009.01) |
| G01S 3/04 | (2006.01) |
| G01S 19/24 | (2010.01) |
| H01Q 1/36 | (2006.01) |
| H01Q 1/42 | (2006.01) |
| H01Q 3/12 | (2006.01) |
| H01Q 21/00 | (2006.01) |
| H01Q 1/12 | (2006.01) |
| H01Q 3/02 | (2006.01) |
| H01Q 3/36 | (2006.01) |
| H01Q 21/24 | (2006.01) |
| H04B 7/0456 | (2017.01) |
| F16M 11/06 | (2006.01) |
| H04L 12/26 | (2006.01) |
| H04W 24/08 | (2009.01) |
| H04W 28/24 | (2009.01) |
| H04W 48/06 | (2009.01) |
| H04W 4/50 | (2018.01) |
| H04W 84/04 | (2009.01) |
| H04W 84/02 | (2009.01) |
| H04W 88/08 | (2009.01) |

(52) U.S. Cl.
CPC ............ *G01S 5/0247* (2013.01); *G01S 19/24* (2013.01); *G01S 19/53* (2013.01); *H01Q 1/02* (2013.01); *H01Q 1/1207* (2013.01); *H01Q 1/1228* (2013.01); *H01Q 1/246* (2013.01); *H01Q 1/36* (2013.01); *H01Q 1/42* (2013.01); *H01Q 1/50* (2013.01); *H01Q 3/02* (2013.01); *H01Q 3/04* (2013.01); *H01Q 3/10* (2013.01); *H01Q 3/12* (2013.01); *H01Q 3/24* (2013.01); *H01Q 3/26* (2013.01); *H01Q 3/2611* (2013.01); *H01Q 3/36* (2013.01); *H01Q 21/00* (2013.01); *H01Q 21/065* (2013.01); *H01Q 21/08* (2013.01); *H01Q 21/205* (2013.01); *H01Q 21/24* (2013.01); *H01Q 21/28* (2013.01); *H01Q 25/002* (2013.01); *H01Q 25/005* (2013.01); *H04B 7/0456* (2013.01); *H04B 7/0617* (2013.01); *H04B 7/0621* (2013.01); *H04B 7/0691* (2013.01); *H04B 7/0695* (2013.01); *H04B 7/086* (2013.01); *H04B 7/088* (2013.01); *H04B 7/0874* (2013.01); *H04L 41/0806* (2013.01); *H04L 41/0816* (2013.01); *H04L 43/0829* (2013.01); *H04L 67/18* (2013.01); *H04L 67/34* (2013.01); *H04W 4/50* (2018.02); *H04W 16/28* (2013.01); *H04W 24/08* (2013.01); *H04W 24/10* (2013.01); *H04W 28/0236* (2013.01); *H04W 28/0268* (2013.01); *H04W 28/0284* (2013.01); *H04W 28/24* (2013.01); *H04W 40/22* (2013.01); *H04W 48/06* (2013.01); *H04W 72/042* (2013.01); *H04W 72/085* (2013.01); *H04W 88/04* (2013.01); *H05K 7/20* (2013.01); *H01Q 1/1257* (2013.01); *H04B 7/0817* (2013.01); *H04W 84/02* (2013.01); *H04W 84/045* (2013.01); *H04W 88/08* (2013.01)

(58) Field of Classification Search
CPC ......... H04W 28/0268; H04W 28/0284; H04W 28/24; H04W 40/22; H04W 48/06; H04W 72/042; H04W 72/085; H04W 88/04; H04W 84/02; H04W 84/045; H04W 88/08; F16M 11/06; G01S 3/043; G01S 3/14; G01S 5/0247; G01S 19/24; G01S 19/53; H01Q 1/02; H01Q 1/1207; H01Q 1/1257; H01Q 1/1228; H01Q 1/36; H01Q 1/42; H01Q 1/50; H01Q 3/02; H01Q 3/10; H01Q 3/12; H01Q 3/24; H01Q 3/26; H01Q 3/2611; H01Q 3/36; H01Q 21/00; H01Q 21/065; H01Q 21/08; H01Q 21/205; H01Q 21/24; H01Q 21/28; H01Q 25/005; H04B 7/0456; H04B 7/0617; H04B 7/0621; H04B 7/0691; H04B 7/0695; H04B 7/086; H04B 7/0874; H04B 7/088; H04B 7/0817; H04L 41/0806; H04L 43/0829; H04L 67/18; H04L 67/34; H05K 7/20
USPC .................. 343/878, 890, 892; 318/3, 34
See application file for complete search history.

(56) References Cited

U.S. PATENT DOCUMENTS

| | | | |
|---|---|---|---|
| 3,844,341 A | 10/1974 | Bimshas, Jr. et al. | |
| 4,436,190 A | 3/1984 | Wentzell | |
| 5,049,891 A | 9/1991 | Ettinger et al. | |
| 5,357,259 A | 10/1994 | Nosal | |
| 6,469,668 B1 | 10/2002 | Jones et al. | |
| 9,970,643 B2 * | 5/2018 | Adema | G03B 21/204 |
| 10,028,154 B2 * | 7/2018 | Elson | H01Q 1/246 |
| 2009/0032223 A1 | 2/2009 | Zimmerman et al. | |
| 2016/0066476 A1 * | 3/2016 | Gu | H04W 88/08 361/715 |
| 2016/0380349 A1 | 12/2016 | Elson | |

FOREIGN PATENT DOCUMENTS

| | | |
|---|---|---|
| CN | 104914412 A | 9/2015 |
| EP | 1093201 A1 | 4/2001 |
| EP | 1355376 A1 | 10/2003 |
| JP | H05139397 A | 6/1993 |
| WO | 2012115722 A1 | 8/2012 |

OTHER PUBLICATIONS

PCT Search Report from PCT/GB2016/051433 (corresponding to U.S. Appl. No. 15/186,955), dated Aug. 9, 2016, 12 pgs.

(56) References Cited

OTHER PUBLICATIONS

PCT Written Opinion from PCT/GB2016/051411, dated May 30, 2017, 7 pgs.
PCT Written Opinion from PCT/GB2016/051433, dated May 30, 2017, 7 pgs.
UK Search Report from GB 1515091.5, dated Feb. 16, 2016, 4 pgs.
UK Search Report from GB 1515093.1, dated Feb. 19, 2016, 4 pgs.
U.S. Notice of Allowance dated Mar. 20, 2018 in related U.S. Appl. No. 15/187,159, 7 pages.

\* cited by examiner

ROTATABLE ANTENNA APPARATUS

CROSS-REFERENCE TO OTHER APPLICATIONS

This application claims priority under 35 U.S.C. 119(b) to UK Application No. 1511200.6, filed 25 Jun. 2015 and entitled "STEERABLE ANTENNA SYSTEM", and to UK Application No. 1515091.5, filed 25 Aug. 2015 and entitled "A ROTATABLE ANTENNA APPARATUS". Both applications are incorporated by reference herein.

BACKGROUND

The present technique relates to a rotatable antenna apparatus, which may be used for example within a telecommunications system.

A rotatable antenna apparatus may be arranged to consist of a fixed unit that is attached to an external structure, for example an item of street furniture such as a lamp post, and a rotatable unit that is mounted on the fixed unit and includes an antenna assembly via which wireless communication signals are transmitted and received.

The antenna assembly needs to be connected to processing circuitry that is used to perform various signal processing operations on the signals to be transmitted by, or the signals received by, the antenna assembly. There are often a significant number of connections required between the antenna assembly and the associated processing circuitry, for example due to the number of individual antennas that may be provided within the antenna assembly, and it is desirable to reduce the length of those various connections in order to reduce signal loss. Accordingly, it would be desirable to place the processing circuitry within the rotatable unit mounted in close proximity to the antenna assembly, as this would reduce the above mentioned losses, and also gives rise to other improvements such as a reduction in lifetime wear issues that would otherwise be present in the various connections between the antenna assembly and the processing circuitry, and certain calibration difficulties that can arise if the processing circuitry is not mounted for rotation with the antenna assembly.

Whilst it is beneficial to have the processing circuitry within the rotatable unit, this can give rise to a heat dissipation issue. In particular, the rotatable unit will typically be sealed from the outside environment via a radome forming an outer enclosure of the rotatable unit. It is desirable in many instances to make the rotatable antenna apparatus relatively small, and accordingly the space inside the radome enclosure is relatively limited. Hence, there is a concern that the heat generated within the enclosure of the rotatable unit from at least some of the components within the processing circuitry could become problematic, reducing the effective lifetime of some of the components, and potentially causing the system to shut down due to overheating.

Accordingly, it would be desirable to provide an efficient mechanism for dissipating the heat from the rotatable unit.

SUMMARY

In one example configuration, there is provided a rotatable antenna apparatus comprising: a fixed unit for attachment of the apparatus to an external structure; a rotatable unit mounted on the fixed unit and comprising an antenna assembly and processing circuitry coupled to the antenna assembly for performing signal processing operations; a thermally conductive shaft connected to the rotatable unit and located for rotation within the fixed unit; a thermally conductive coupling structure to conduct heat from one or more heating generating components of the processing circuitry into the thermally conductive shaft; and a heat sink formed within the fixed unit and thermally coupled to the thermally conductive shaft.

The rotatable antenna apparatus includes a fixed unit for attachment of the apparatus to an external structure and a rotatable unit mounted on the fixed unit within which both the antenna assembly and associated processing circuits are provided. A shaft is connected to the rotatable unit and located for rotation within the fixed unit, hence providing an axis about which the rotatable unit can rotate. In accordance with the above example configuration, the shaft is made of a thermally conductive material. Furthermore, a firmly conductive coupling structure is provided to conduct heat from one or more heat generating components of the processing circuitry into the thermally conductive shaft. In addition, a heat sink within the fixed unit is then thermally coupled to the thermally conductive shaft. As a result, heat generated by one or more components within the processing circuitry is conducted through the thermally conductive coupling structure into the thermally conductive shaft, from where the heat is then dissipated via the heat sink thermally coupled to that shaft.

This provides a very efficient mechanism for extracting the heat from the rotatable unit. Further, it avoids any need to compromise the barrier against the external environment afforded by the radome and any other housing features forming the external surface of the rotatable unit.

Since the components provided within the rotatable unit can still effectively be sealed from the external environment, it is possible to use standard components within the rotatable unit that do not themselves need to be capable of handling exposure to the external environment, whilst providing an effective mechanism for the heat generated by such components to be dissipated away from the rotatable unit. This hence facilitates a significant reduction in the cost that might otherwise be associated with the production of the rotatable unit.

The thermally conductive coupling structure can take a variety of forms but in one embodiment comprises a component interface structure thermally coupled to the one or more heat generating components, and an elongate member coupling the component interface structure to the thermally conductive shaft. Hence, the component interface structure can be positioned in close proximity to the relevant components within the processing circuitry, to provide a very effective mechanism for drawing the heat away from those components, with the elongate member then being used to transfer that heat to the thermally conductive shaft.

In one embodiment, both the thermally conductive shaft and the thermally conductive coupling structure may be formed as a unitary structure, made of the same thermally conductive material. In one such example, it may be possible for such a unitary structure to be formed from a thermally conductive metal such as copper. However, in one embodiment the elongate member is a separate component to both the component interface structure and the thermally conductive shaft. To ensure a good transfer of heat from the elongate member into the thermally conductive shaft, in one embodiment the elongate member extends into a recess provided within the thermally conductive shaft, so as to provide a significant contact surface area between the elongate member and the thermally conductive shaft. Similarly, in one embodiment, the elongate member extends into a further recess provided within the component interface structure, hence providing a good thermal coupling between the component interface structure and the elongate member.

The component interface structure can take a variety of forms, but in one embodiment comprises a first part arranged for thermally coupling to the one or more heat generating components and a second part connected to the first part so as to clamp the elongate member between the first part and the second part. The clamping action can be used to ensure that the elongate member is held tightly within the component interface structure, hence ensuring a good heat transfer between the component interface structure and the elongate member.

In one embodiment, to further improve the heat transfer properties between the individual components, thermal paste is applied between the elongate member and one or both of the component interface structure and the thermally conductive shaft.

The elongate member can take a variety of forms. However, in one embodiment the elongate member takes the form of a heat pipe. A heat pipe is a very efficient heat-transfer device that combines the principles of both thermal conductivity and phase transition to efficiently manage the transfer of heat between two solid interfaces. A heat pipe will typically include a vapour cavity containing some working liquid, surrounded by a wick. At the hot interface of the heat pipe, the working liquid within the vapour cavity turns into a vapour by absorbing heat from the hot surface. The vapour then travels along the heat pipe to the cold interface and condenses back into a liquid, releasing the latent heat. The liquid then returns to the hot interface via the wick.

There are a number of commercially available heat pipes which can readily be used as the elongate member, and in one embodiment the heat pipe takes the form of an elongate cylinder coupled between the component interface structure and the thermally conductive shaft.

Whilst in one embodiment the component interface structure may merely be placed in close proximity to the heat generating components, for example drawing the heat away over a small air gap, in one embodiment heat pad elements are provided sandwiched between the various heat generating components and the component interface structure in order to provide an efficient thermal coupling between the component interface structure and those heat generating components.

There are a number of ways in which the heat sink may be coupled to the thermally conductive shaft, in use the shaft rotating relative to the heat sink. In one example arrangement a small air gap may be provided. However in another embodiment a cooling fluid (more particularly in one embodiment a cooling liquid) is provided at the interface between the thermally conductive shaft and the heat sink to provide an efficient thermal coupling between those two components. There are a number of ways in which the cooling fluid can be held between the thermally conductive shaft and the heat sink. In one embodiment, the thermally conductive shaft is positioned in a locating recess within the fixed unit and the cooling fluid is provided in the locating recess.

There are a number of orientations in which the heat sink may be provided relative to the thermally conductive shaft, but in one embodiment the heat sink is provided around the periphery of the locating recess, hence serving to effectively surround the thermally conductive shaft. This hence increases the efficiency with which heat can be drawn away from the shaft into the heat sink.

The thermally conductive shaft can take a variety of forms, but in one embodiment is provided with a series of splines around its peripheral edge defining fluid receiving passages for the cooling fluid. The presence of the splines hence increases the amount of fluid that can be provided at the interface between the shaft and the heat sink, effectively increasing the surface area of the cooling fluid, and hence increasing the efficiency of the thermal transfer between the shaft and the heat sink.

Whilst the use of the thermally conductive shaft and thermally conductive coupling structure provides a primary heat dissipation path from the heat generating components of the processing circuitry, in one embodiment one or more further auxiliary paths may be provided. For example, in one embodiment, the rotatable unit includes a thermally conductive housing in which the processing circuitry is located, the thermally conductive housing being coupled to the thermally conductive shaft to provide an auxiliary path for conduction of heat to the heat sink. For example, the processing circuitry may be enclosed within a metal housing, in order to protect those components from external interference generating signals. However, since that metal housing is itself coupled to the thermally conductive shaft, it provides an auxiliary route by which heat generated by components of the processing circuitry can be conducted to the heat sink.

In another example configuration, there is provided a rotatable antenna apparatus comprising: fixed means for attachment of the apparatus to an external structure; rotatable means for mounting on the fixed means and comprising an antenna means and processing means coupled to the antenna means for performing signal processing operations; a thermally conductive shaft means connected to the rotatable means and located for rotation within the fixed means; a thermally conductive coupling means for conducting heat from one or more heating generating components of the processing means into the thermally conductive shaft means; and heat sink means within the fixed means for thermal coupling to the thermally conductive shaft means.

BRIEF DESCRIPTION OF THE DRAWINGS

The present technique will be described further, by way of example only, with reference to embodiments thereof as illustrated in the accompanying drawings, in which.

DESCRIPTION OF EMBODIMENTS

Figure 1:
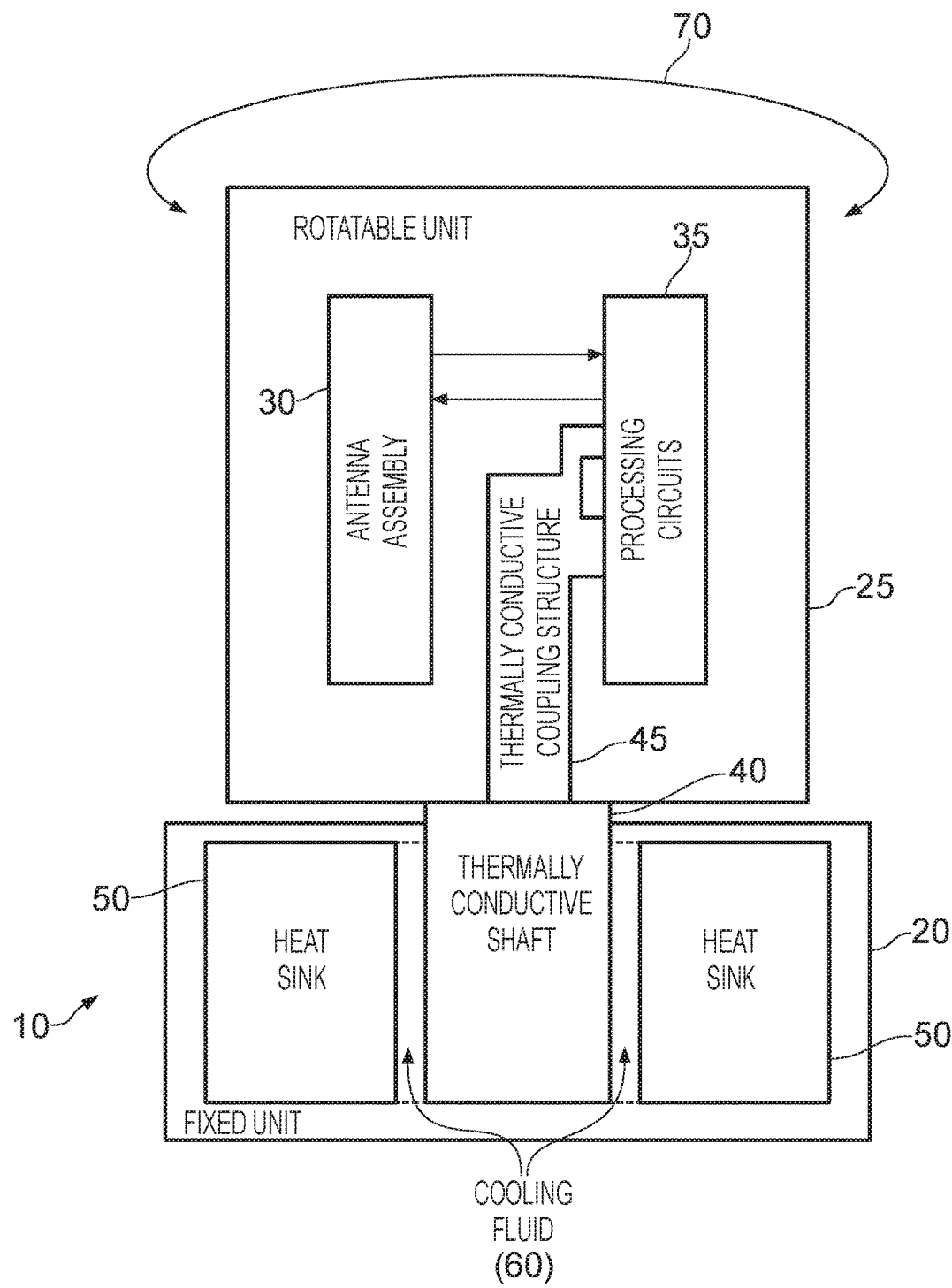
FIG. 1 is a block diagram of a rotatable antenna apparatus in accordance with one embodiment.

FIG. 1 is a block diagram of a rotatable antenna apparatus in accordance with one embodiment. The apparatus 10 includes a fixed unit 20 that is arranged to be attached to an external structure, for example an item of street furniture such as a lamp post. A rotatable unit 25 is then mounted on the fixed unit 20 via a thermally conductive shaft 40 located in a recess of the fixed unit and free to rotate within that recess so as to allow the rotatable unit to rotate as indicated by the arrow 70.

The rotatable unit includes an antenna assembly 30 containing one or more antennas used to transmit and/or receive wireless signals, the antenna assembly being connected to associated processing circuits 35 via a series of wired connections. The processing circuits may for example include transceiver circuits used to perform various signal processing operations on signals received by the antenna, and/or certain pre-transmission signal processing operations on signals to be transmitted by the antenna assembly 30.

For the reasons discussed earlier, it is beneficial to include the processing circuits 35 in close proximity to the antenna assembly 30 within the rotatable unit 25. However, an issue that can arise from such an arrangement is that one or more of the components within the processing circuitry may generate a significant amount of heat during use. In one embodiment, the overall volume of the rotatable unit is relatively small, and further is entirely sealed against atmospheric conditions by a housing including a radome, and hence it is likely that a significant build up of heat will occur within the rotatable unit 25. Such a build up of heat could reduce the working life of the components, and potentially cause the antenna apparatus to shut down due to overheating.

To alleviate this problem, whilst avoiding the need to compromise the seal against external environmental conditions provided by the housing of the rotatable unit 25, a thermally conductive coupling structure 45 is provided to draw heat away from one or more components of the processing circuits to the shaft 40. In addition, the shaft 40 is made of a thermally conductive material, so that the heat transferred by the thermally conductive coupling structure 45 is then transferred into the shaft 40.

Furthermore, as shown in FIG. 1, a heat sink 50 is provided around the thermally conductive shaft 40 in order to draw heat away from the thermally conductive shaft. The heat sink then allows the heat to be dissipated into the external environment. In particular, as will be discussed in more detail later with reference to the specific embodiments described, the heat sink can effectively form the main body of the fixed unit 20 and provide a direct contact with the external environment to allow the heat to be dissipated.

To improve the thermal coupling between the rotating shaft 40 and the stationary heat sink 50, a cooling fluid 60 can be introduced at the interface between the thermally conductive shaft 40 and the heat sink 50.

Figure 2:
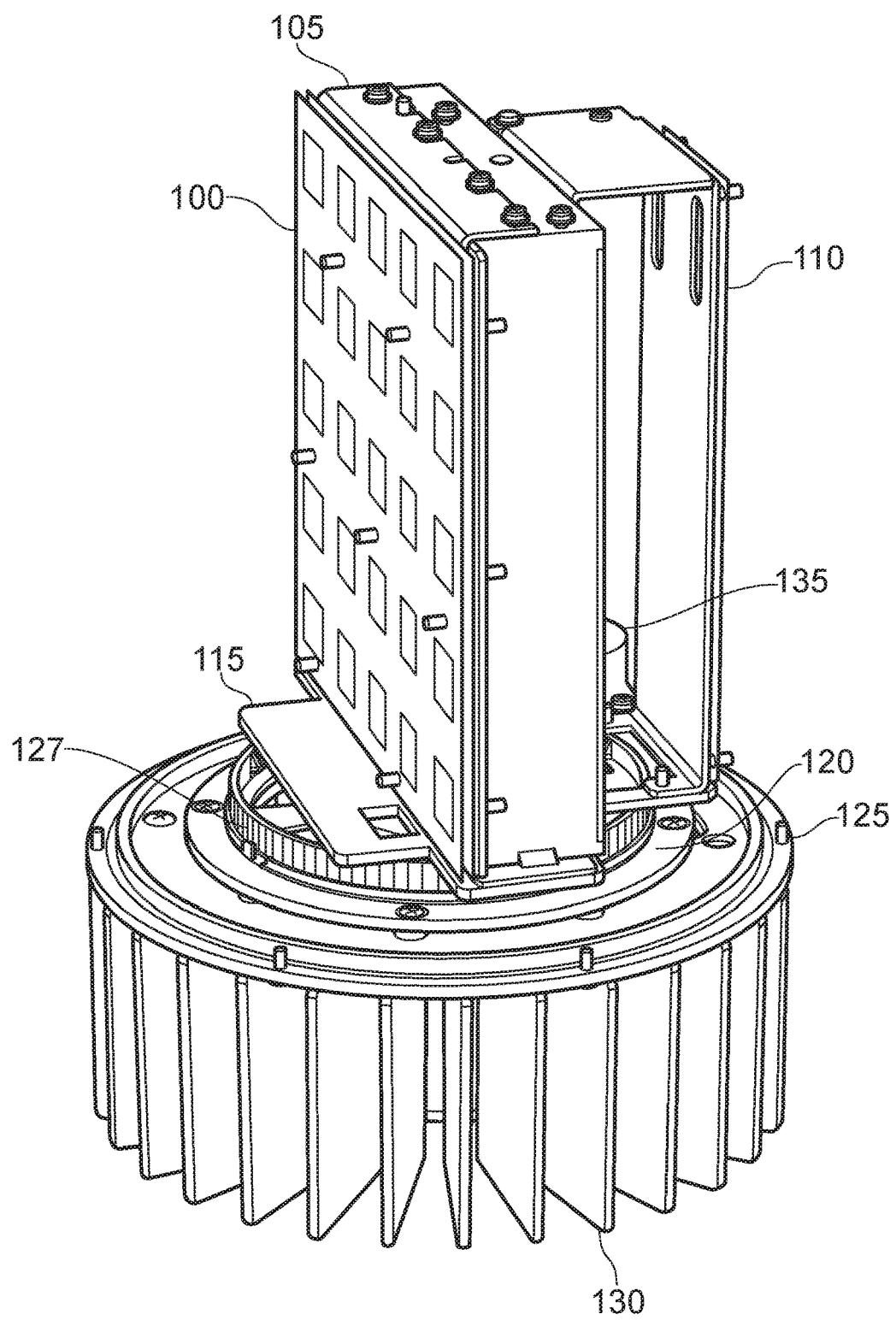
FIG. 2 illustrates a rotatable antenna apparatus of one embodiment.

FIG. 2 is a diagram illustrating a rotatable antenna apparatus in accordance with one embodiment. An antenna assembly 100 is located on a first face of a housing 105, the housing 105 containing within it the processing circuits used to interface with the antenna assembly. In the example shown in FIG. 2 it is assumed that the antenna assembly 100 takes the form of an antenna array comprising an array of separate antennas, and in one embodiment the processing circuitry can communicate individually with each of the antennas in the array.

In the embodiment shown in FIG. 2, there is also a rear facing antenna assembly 110 which is also coupled to the processing circuits. The housing 105 and associated antenna assemblies 100, 110 are mounted on a support plate 115 which is connected to the thermally conductive shaft 40 shown in FIG. 1.

As shown in FIG. 2, the fixed unit 125 can incorporate around its periphery a series of fins 130 forming part of the heat sink, providing a significant surface area from which heat can be dissipated into the environment.

As also shown in FIG. 2, an interface unit 120 is provided between the fixed unit and the rotatable unit, this interface comprising a fixed part which in this embodiment includes an annular surface 127 having a series of vertically arranged teeth, and also includes within the fixed part a rotating part connected to the support plate 115. The overall configuration of the interface unit 120 in this embodiment is annular, with the interface unit being mounted on the thermally conductive shaft 40. Accordingly, the interface unit does not interfere with the operation of the thermally conductive shaft. The interface unit can serve a variety of purposes, and in one embodiment is used to enable the routing of cable between the fixed unit and the rotatable unit. In addition, the upstanding teeth provided by the annular service 127 can be used to engage with a drive belt that in turn is connected to a motor 135, such that when the motor is driven, this serves to rotate the rotatable part.

It will be appreciated however that any suitable mechanism may be provided for rotating the rotatable unit of the antenna apparatus, and for provisioning any cabling between the rotatable unit and the fixed unit, and the interface unit 120 is an optional feature not related to the thermal conduction mechanism of the described embodiments.

Figure 3:
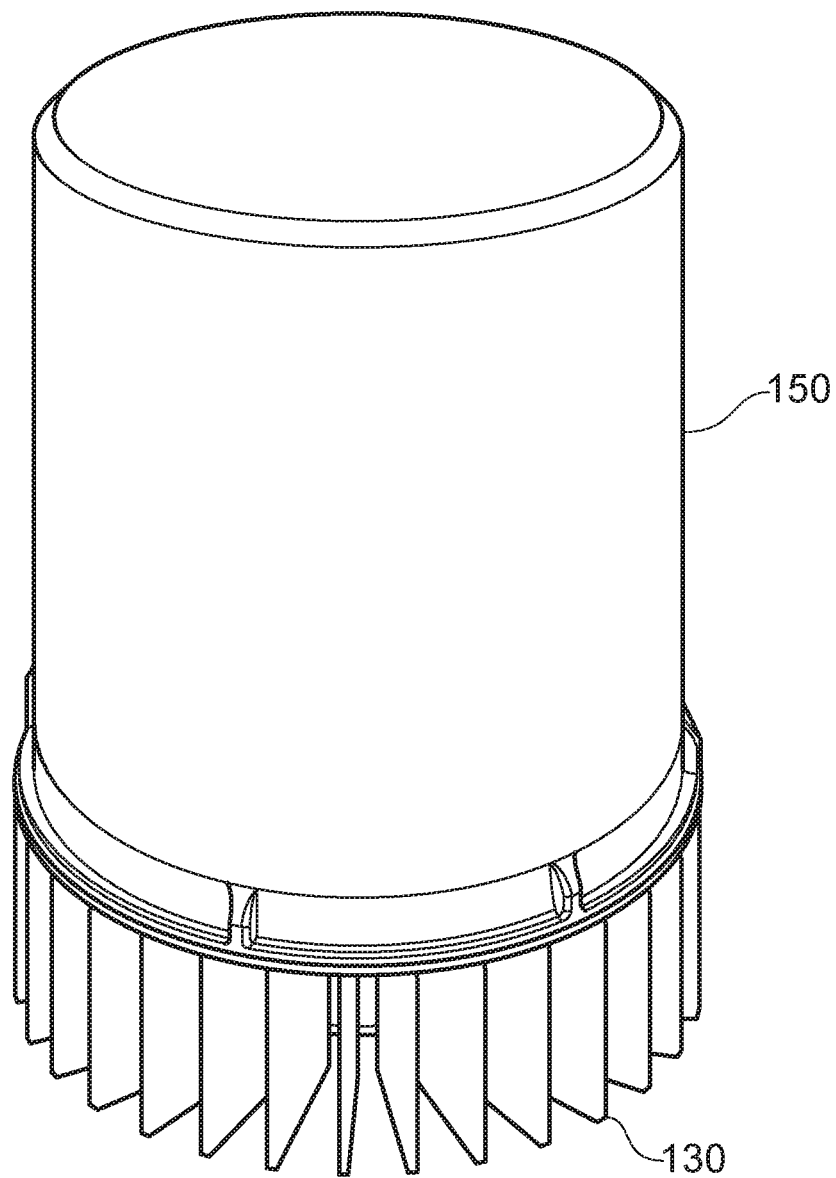
FIG. 3 illustrates the rotatable antenna apparatus of FIG. 2 with a radome fitted to enclose the rotatable portion of the antenna apparatus.

FIG. 3 illustrates the rotatable antenna apparatus of FIG. 2 with a radome 150 secured over the rotatable portion, hence sealing the rotatable portion of the antenna from external environmental conditions. As mentioned earlier, this enables standard, low cost, components to be used within the rotatable portion of the antenna, due to those components not needing to withstand exposure to external environmental conditions, and the thermal conduction mechanism of the described embodiments allows the heat generated by components provided within the space enclosed by the radome 150 to be drawn away and dissipated through the fins 130 of the heat sink.

Figure 4:
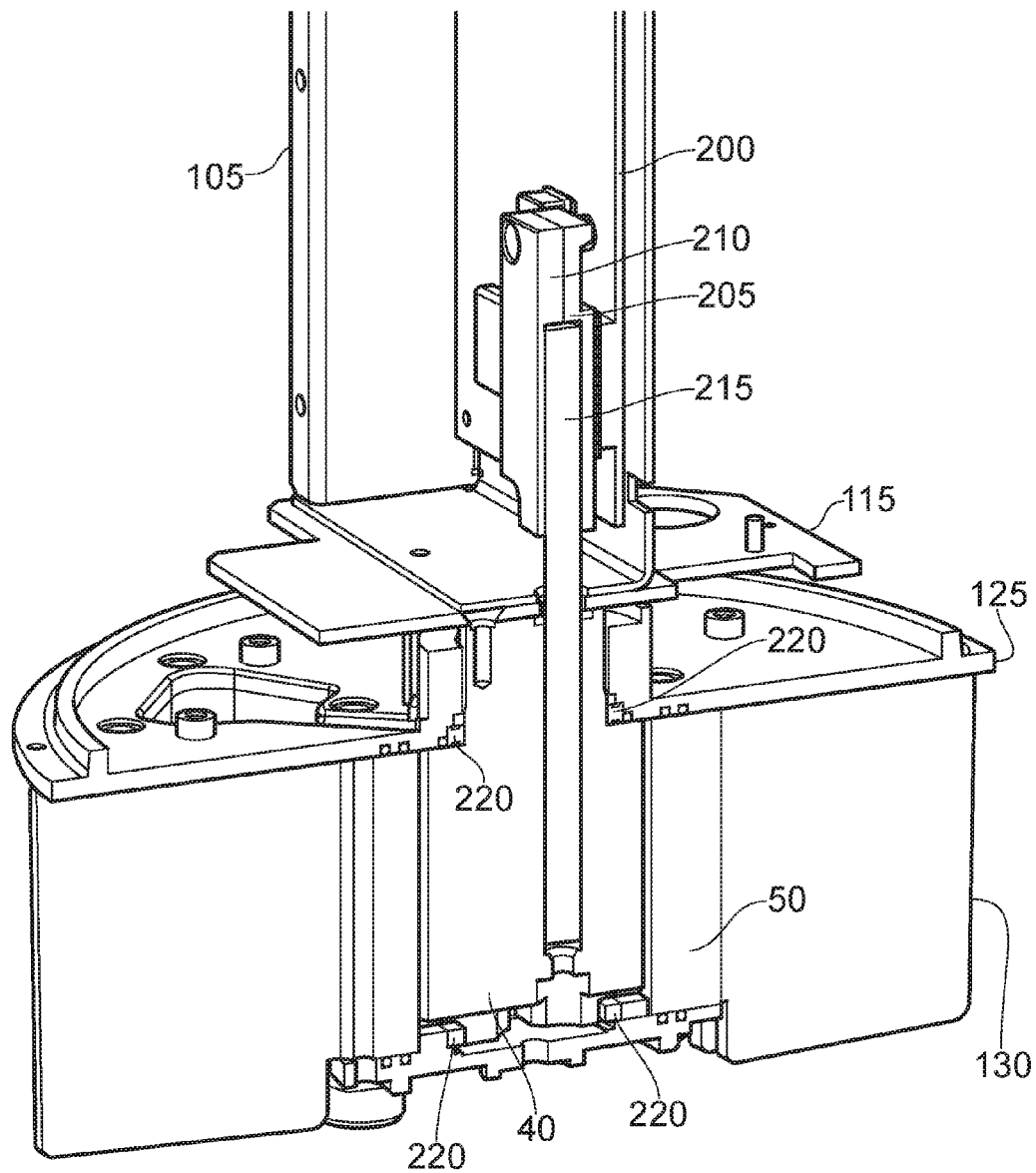
FIG. 4 is a cross-sectional view showing certain components provided within the rotatable antenna apparatus of one embodiment.

FIG. 4 is a cross-sectional view, showing certain components provided within the rotatable antenna apparatus of one embodiment, and in particular illustrates the thermally conductive path provided. As shown, a circuit board 200 is provided within the housing 105, the circuit board providing a series of processing circuits, including one or more processing circuits that generate a significant amount of heat. A component interface structure formed in this embodiment by the parts 205, 210 is then provided at a location enabling it to provide a very efficient thermal coupling with those heat generating components, so that the heat generated by those components is transferred into the component interface structure.

As also shown in FIG. 4, the component interface structure formed by the two parts, including in this example a heat block 205 and a heat block clamp 210, clamps around a first end of an elongate member, which in one embodiment is formed by a heat pipe 215, the heat pipe providing a very efficient mechanism for transferring the heat conducted into one end of the heat pipe (from the component interface structure) to the other end of the heat pipe.

As can be seen, the other end of the heat pipe is received within a recess in the thermally conductive shaft 40, and accordingly this mechanism provides an efficient way to route the heat from the components into the shaft, from where it can then be dissipated into the heat sink 50 that surrounds the shaft, so that the heat can be dissipated from the series of fins 130 provided in direct contact with the atmosphere.

As shown in FIG. 4, a series of bearings 220 are provided to allow the shaft 40 to rotate freely within the fixed unit 125. As shown, a narrow gap exists between the outer peripheral edge of the thermally conductive shaft 40 and the heat sink 50. If desired, to improve the thermal transfer between the shaft 40 and the heat sink 50, a cooling fluid can be introduced into the gap.

Figure 5:
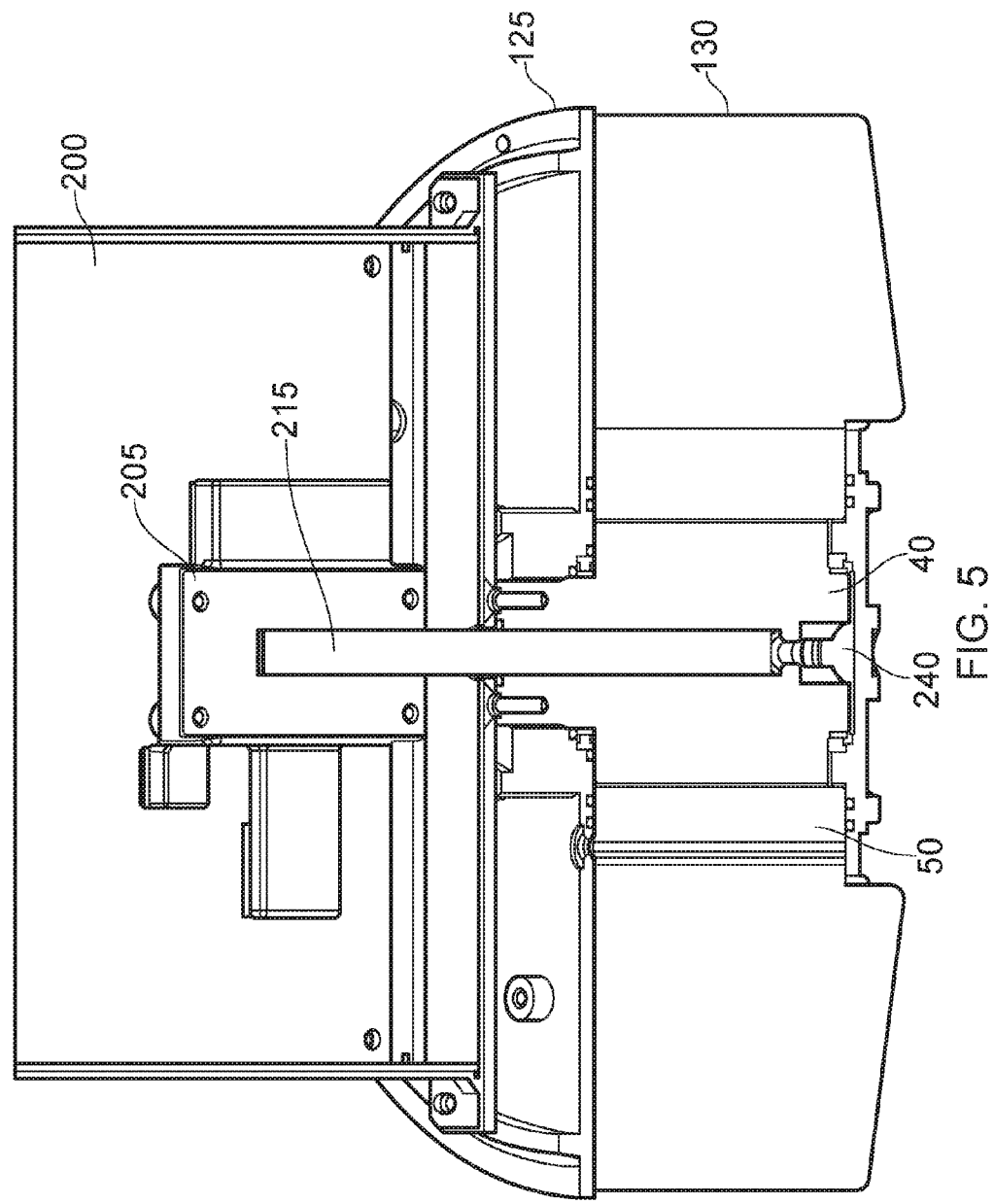
FIG. 5 is a further cross-sectional view showing in more detail the thermal path provided within the apparatus to dissipate heat from heat generating components, in accordance with one embodiment.

FIG. 5 illustrates another sectional view taken parallel with the plane of the circuit board 200. In this cross-sectional view, only the first part of the component interface structure is shown, this also being referred to herein as a heat block 205. As clearly shown, the heat pipe 215 is received within a recess of the heat block 205, and passes down into a recess within the shaft 40.

An entry point below the shaft 40 is provided for introducing the cooling fluid into the apparatus during assembly, whereafter a threaded plug 240 is introduced to seal the cooling fluid within the unit, the cooling fluid then providing a thermally efficient heat transfer junction between the rotating shaft 40 and the fixed heat sink 50 with its associated fins 130.

Figure 6:
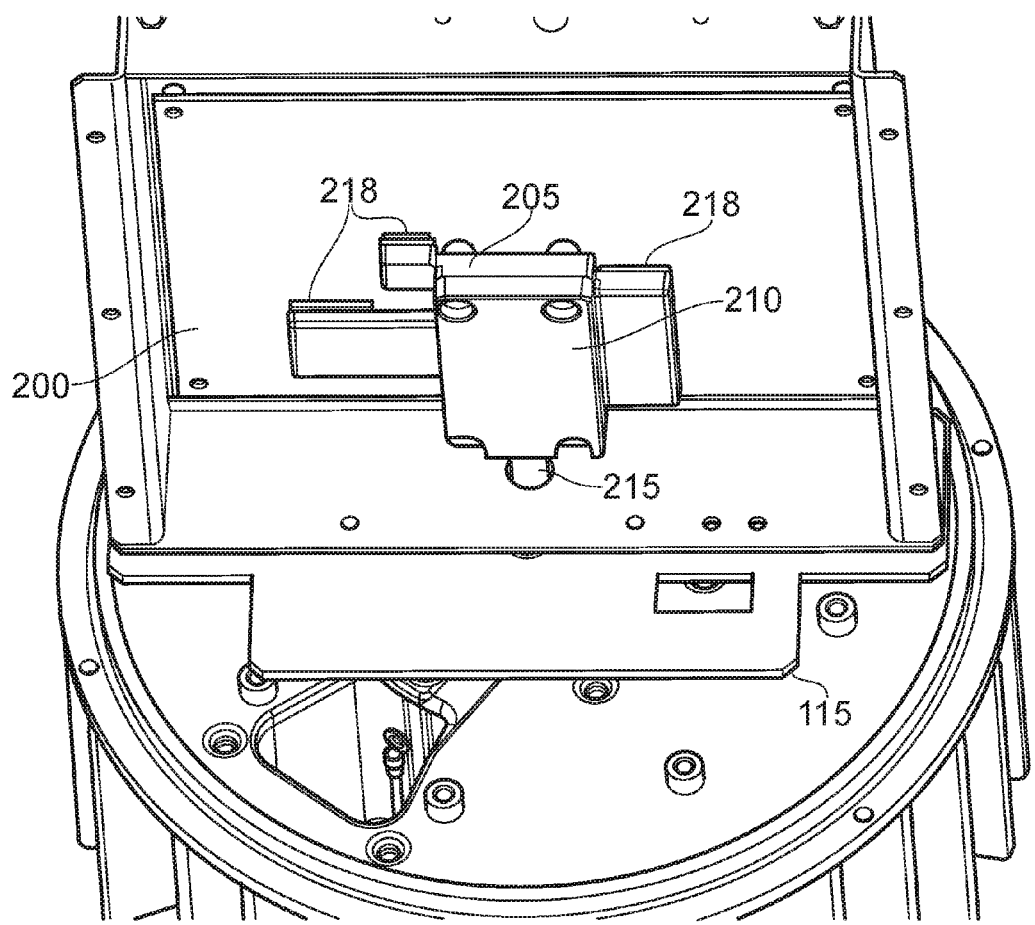
FIG. 6 is a perspective view showing certain components used to dissipate heat away from the heat generating components in accordance with one embodiment.

FIG. 6 shows a perspective view of some of the components within the antenna apparatus, and particularly provides more detail of the component interface structure. In particular, the heat block 205 is shaped so as to overlap with the heat generating components on the circuit board 200, and at the interface between the heat block 205 and those components, a series of heat pads 218 can be located to effectively provide direct contact between the heat generating components and the heat pad 205 in order to improve the thermal transfer properties. The second part of the component interface structure is also shown in FIG. 6, and acts to clamp the heat pipe 215 between the heat block 205 and this second part, which is also referred to herein as the heat block clamp 210.

Figure 7:
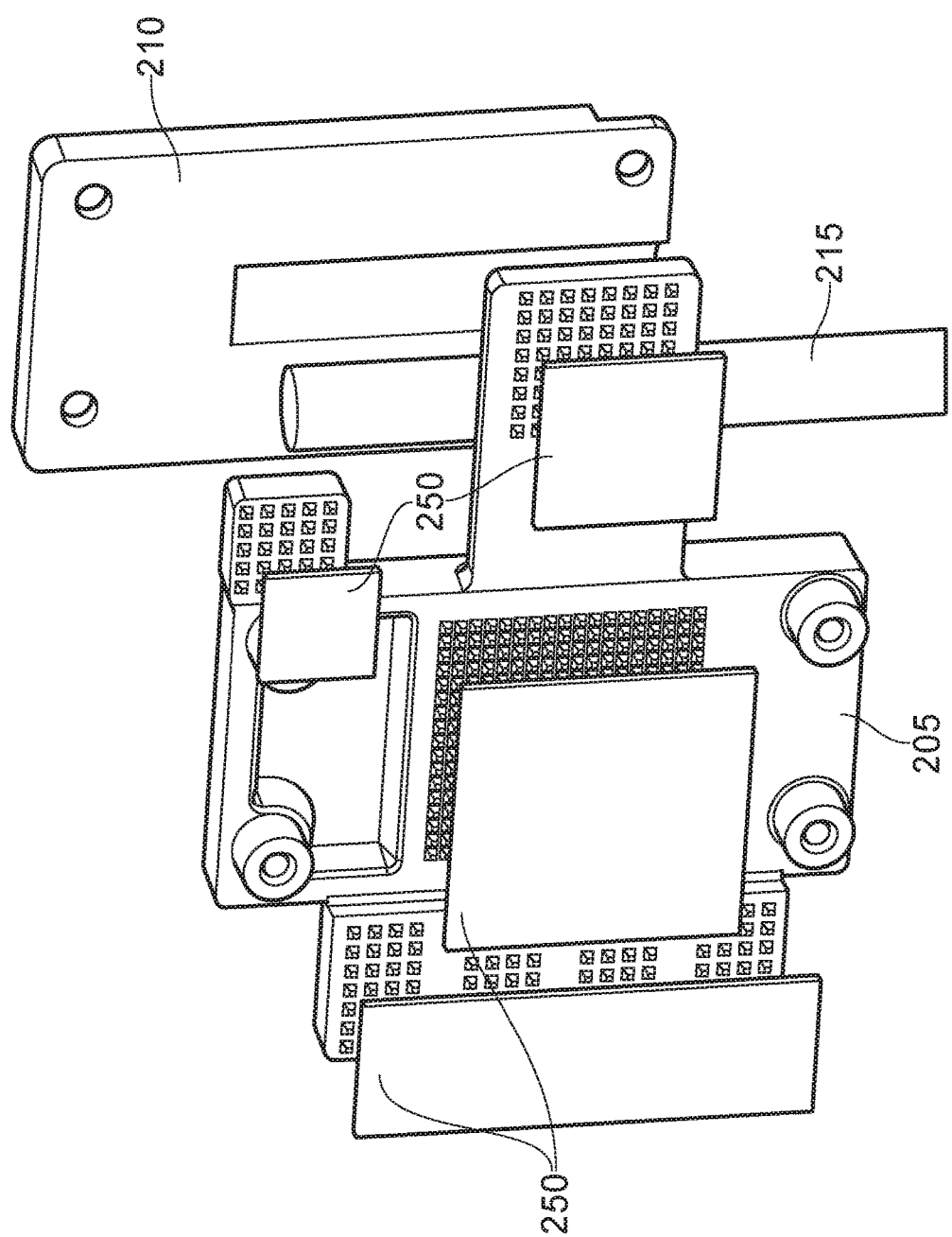
FIG. 7 is an exploded view showing components provided to form a thermally conductive coupling structure in accordance with one embodiment.

FIG. 7 shows an exploded view of the various parts forming the component interface structure. The heat block 205 and heat block clamp 210 are clamped together by suitable fastening means such as screws or bolts, and serve to clamp one end of the heat pipe 215 within the recesses provided within the heat block 205 and heat block clamp 210. Thermal paste may be applied between the heat block components 205, 210 and the heat pipe 215 in order to further improve the thermal transfer properties.

As also shown in FIG. 7, in the areas of the heat block 205 positioned to overlap with surfaces of heat generating components on the circuit board 200, a surface pattern can be applied to produce a roughened surface against which thermal pads 250 can be adhered. The thermal pads are then pressed directly onto the surface of the relevant components on the circuit board whose heat is to be dissipated via the heat dissipation mechanism described herein.

Figure 8A:
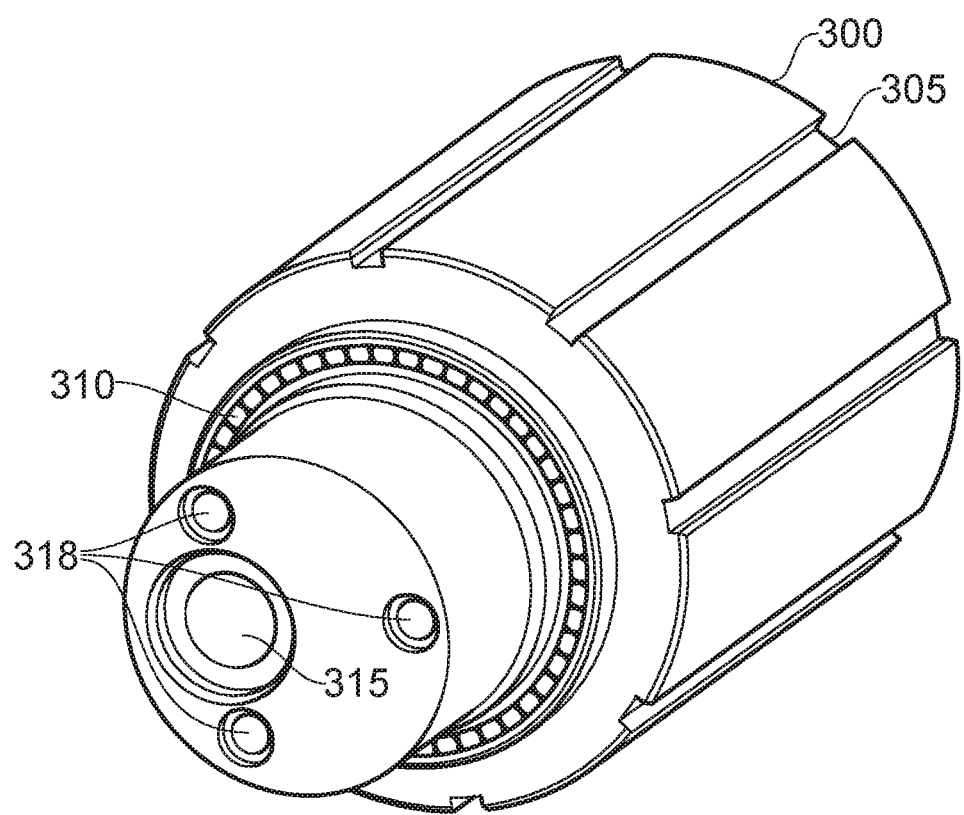
FIGS. 8A and 8B illustrate the thermally conductive shaft used in one embodiment.
Figure 8B:
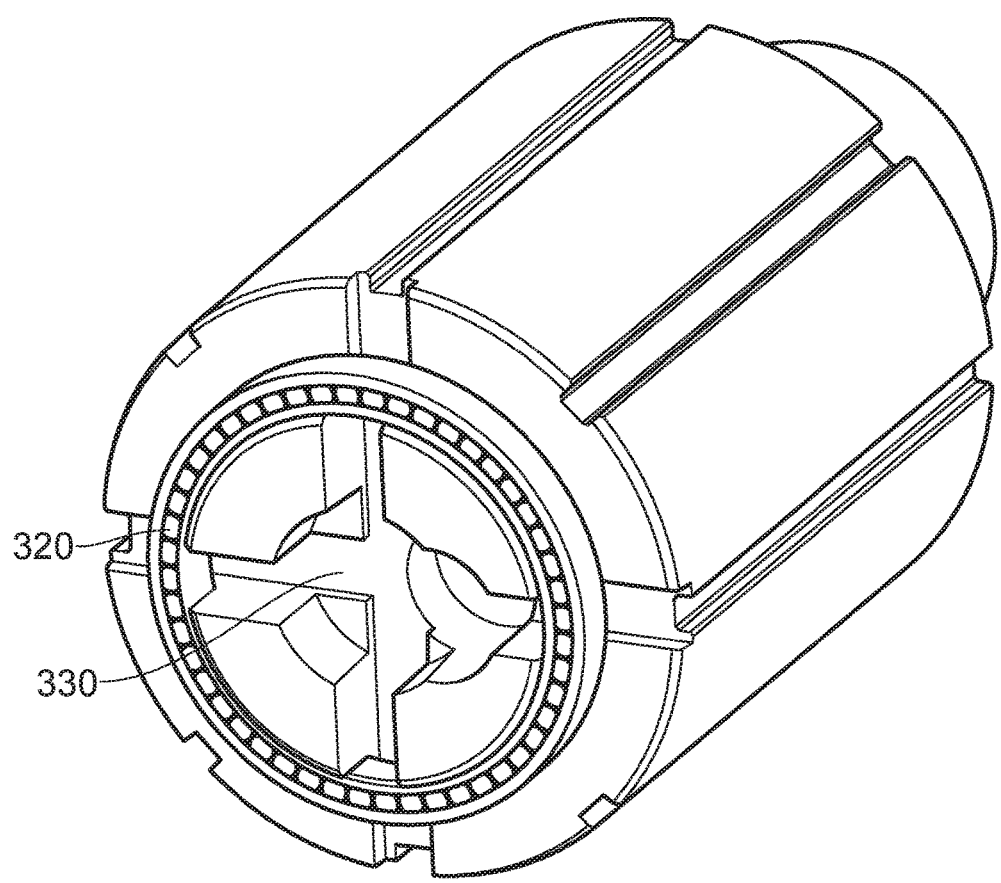

FIGS. 8A and 8B illustrate the construction of the thermally conductive shaft 300 in one embodiment. As shown in FIG. 8A, a recess 315 is provided in the top end of the shaft to receive the heat pipe 215. Further, a series of screw holes 318 are provided to enable the top end of the shaft to be affixed to the support plate 115 supporting the various rotatable components of the antenna apparatus. As shown in both FIGS. 8A and 8B, the shaft has a series of bearings 310, 320 provided thereon to facilitate smooth rotation of the shaft within the heat sink 50.

Further, in one embodiment a series of splines 305 are provided around the outer peripheral edge of the thermally conductive shaft 40 that is thermally coupled to the heat sink 50. The provision of the splines 305 increases the volume of cooling fluid that can be introduced in the gap between the shaft 40 and the heat sink 50, hence improving the effective surface area of the cooling fluid, and hence improving the thermal transfer between the rotating shaft and the heat sink. As also shown in FIG. 8B, a chamber 330 can be provided at the lower end of the shaft to further increase the volume of cooling fluid that can be introduced.

Figure 9:
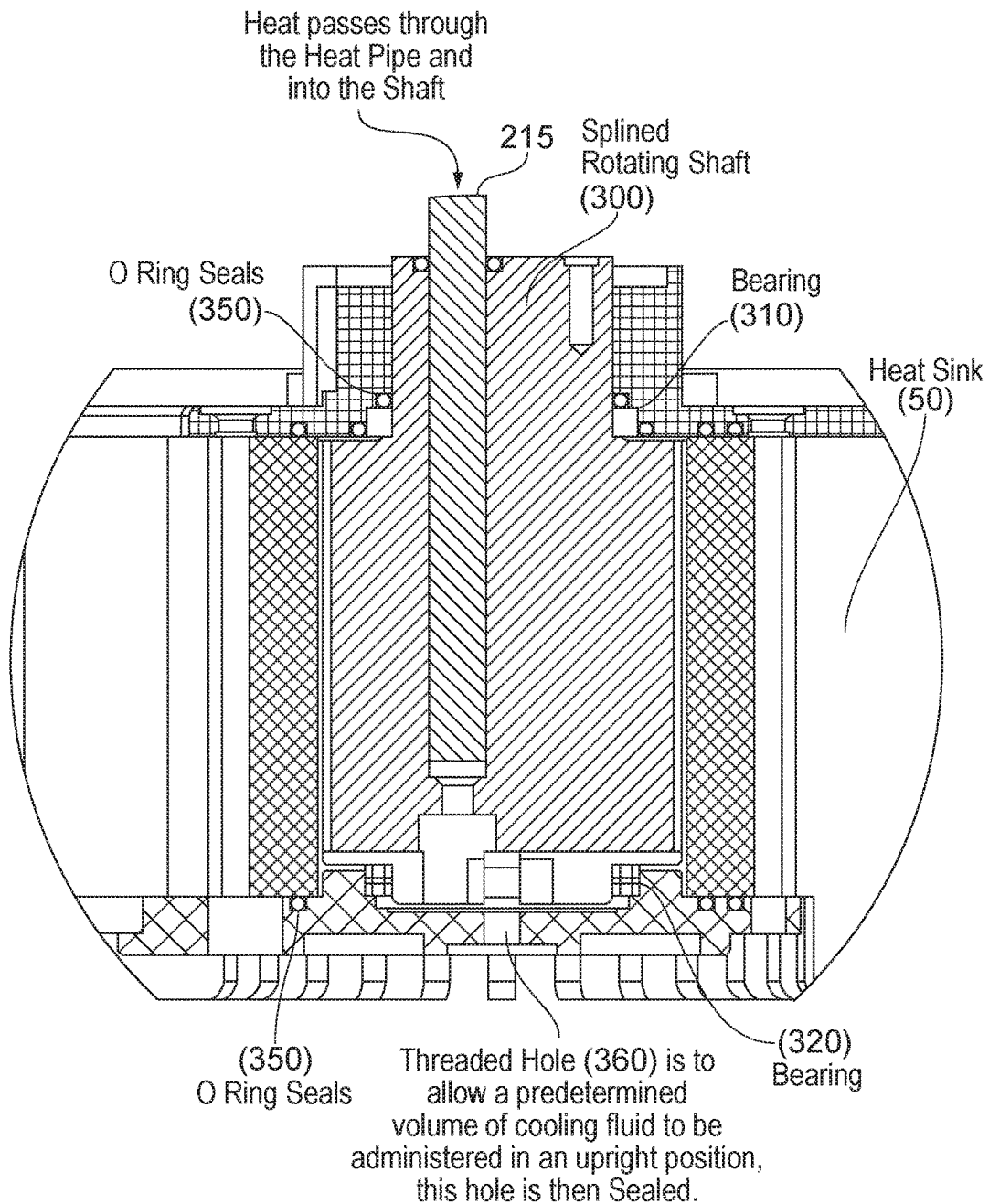
FIG. 9 is a cross-sectional view showing in more detail the provision of the thermally conductive shaft within the fixed unit in accordance with one embodiment.

FIG. 9 is a cross-sectional view showing in more detail the various components provided at the interface between the shaft 40 and heat sink 50. As discussed previously, heat passes through the heat pipe 215 into the splined rotating shaft 300 mounted via the bearings 310, 320 for rotation within the heat sink 50. A threaded hole 360 in the bottom bearing plate is provided to allow a predetermined volume of cooling fluid to be administered in an upright position, this hole then being sealed for example using the thread plug 240 discussed earlier with reference to FIG. 5. Various O-ring seals 350 within the design are then used to stop the coolant from escaping. This allows the coolant to act as a thermally conductive media between the thermally conductive shaft and the heat sink 50.

The splined rotating shaft 300 and the heat sink 50 can be made of any suitable thermally conductive material, but in one embodiment both components are formed from aluminium.

Figure 10:
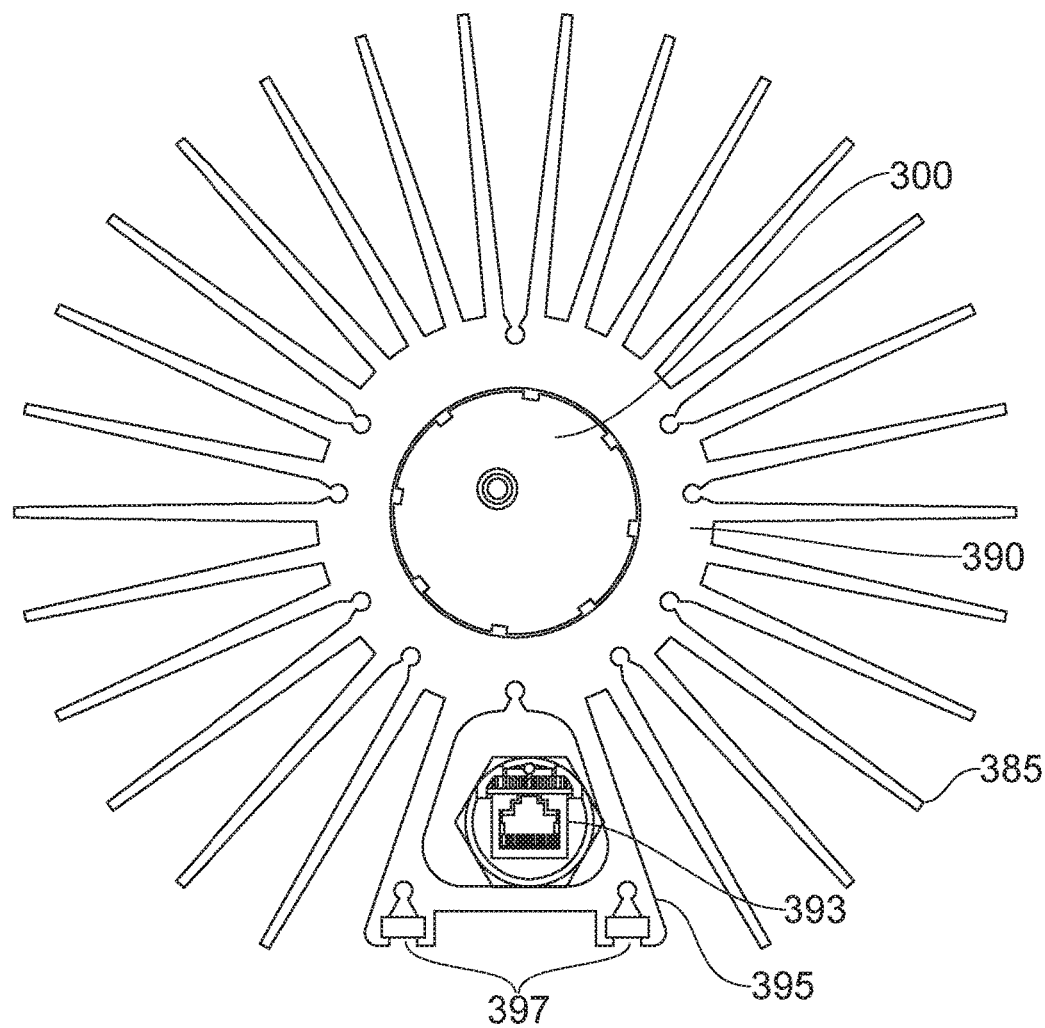
FIG. 10 shows a cross-section through the base unit and thermally conductive shaft in accordance with one embodiment.

FIG. 10 is a cross-section taken through the fixed unit and viewed from underneath. It shows the splined rotating shaft 300 incorporated within the heat sink, which in this embodiment takes the form of a central hub 390 around which a series of splines 385 are provided. As schematically shown by the block 395, other functionality can also be incorporated within the fixed unit, in this example a cable interface 393 to allow power and data connectivity to be provisioned to the fixed unit, from where it can then be routed to components within the rotatable unit. In addition, mounting features 397 can also be provided to enable the fixed unit to be mounted to an external structure such as a lamp post.

From the above described embodiments, it will be seen that such embodiments provide an efficient mechanism for conducting heat away from heat conducting components within the rotatable unit of a rotatable antenna apparatus, by drawing the heat via a thermally conductive coupling structure into the shaft upon which the rotatable unit is mounted. The shaft is made of a thermally conductive material, and is also enclosed by a heat sink that is exposed to the external environment, hence providing an efficient route for dissipating the heat to the external environment. Such an approach does not compromise the sealed nature of the rotatable unit, hence enabling the components within the rotatable unit to continue to be sealed from the external environment, allowing the use of low cost components.

It should further be noted that the heat dissipating mechanism of the described embodiments places no restriction on the manner in which, and the extent to which, the rotatable unit can be rotated.

It has been found that a rotatable antenna apparatus incorporating the heat dissipation mechanism of the above described embodiments can be manufactured in high volumes at low cost, and hence provides an attractive solution for many deployment scenarios requiring rotatable antenna apparatus. In one particular embodiment, such a rotatable antenna apparatus can be deployed in a wireless backhaul network used to connect an access network such as a mobile phone network with the wired telecommunications infrastructure. In one embodiment, such rotatable antenna apparatus can be used at any of the nodes in the backhaul network, and due to the relatively low cost can be readily deployed in a small-cell system.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

We claim:

1. A rotatable antenna apparatus comprising:
   a fixed unit for attachment of the apparatus to an external structure;
   a rotatable unit mounted on the fixed unit and comprising an antenna assembly and processing circuitry coupled to the antenna assembly for performing signal processing operations;
   a thermally conductive shaft connected to the rotatable unit and located for rotation within the fixed unit;
   a thermally conductive coupling structure to conduct heat from one or more heating generating components of the processing circuitry into the thermally conductive shaft; and
   a heat sink formed within the fixed unit and thermally coupled to the thermally conductive shaft.

2. A rotatable antenna apparatus as claimed in claim 1, wherein:
   the thermally conductive coupling structure comprises a component interface structure thermally coupled to said one or more heat generating components, and an elongate member coupling the component interface structure to the thermally conductive shaft.

3. A rotatable antenna apparatus as claimed in claim 2, wherein the elongate member extends into a recess provided within the thermally conductive shaft.

4. A rotatable antenna apparatus as claimed in claim 2, wherein the elongate member extends into a further recess provided within the component interface structure.

5. A rotatable antenna apparatus as claimed in claim 2, wherein the component interface structure comprises a first part arranged for thermally coupling to said one or more heat generating components and a second part connected to the first part so as to clamp the elongate member between the first part and the second part.

6. A rotatable antenna apparatus as claimed in claim 2, wherein thermal paste is applied between the elongate member and at least one of the component interface structure and the thermally conductive shaft.

7. A rotatable antenna apparatus as claimed in claim 2, wherein the elongate member comprises a heat pipe.

8. A rotatable antenna apparatus as claimed in claim 2, further comprising a heat pad sandwiched between said one or more heat generating components and the component interface structure in order to provide the thermal coupling between the component interface structure and said one or more heat generating components.

9. A rotatable antenna apparatus as claimed in claim 1, wherein the heat sink is thermally coupled to the thermally conductive shaft via a cooling fluid.

10. A rotatable antenna apparatus as claimed in claim 9, wherein the thermally conductive shaft is positioned in a locating recess within the fixed unit and the cooling fluid is provided in the locating recess.

11. A rotatable antenna apparatus as claimed in claim 9, wherein the heat sink is provided around a periphery of the locating recess.

12. A rotatable antenna apparatus as claimed in claim 9, wherein the thermally conductive shaft is provided with a series of splines around its peripheral edge defining fluid receiving passages for the cooling fluid.

13. A rotatable antenna apparatus as claimed in claim 1, wherein the rotatable unit includes a thermally conductive housing in which the processing circuitry is located, the thermally conductive housing being coupled to the thermally conductive shaft to provide an auxiliary path for conduction of heat to the heat sink.

14. A rotatable antenna apparatus comprising:
   fixed means for attachment of the apparatus to an external structure;
   rotatable means for mounting on the fixed means and comprising an antenna means and processing means coupled to the antenna means for performing signal processing operations;
   a thermally conductive shaft means connected to the rotatable means and located for rotation within the fixed means;
   a thermally conductive coupling means for conducting heat from one or more heating generating components of the processing means into the thermally conductive shaft means; and
   heat sink means within the fixed means for thermal coupling to the thermally conductive shaft means.

* * * * *